(12) United States Patent
Hong et al.

(10) Patent No.: US 10,930,626 B2
(45) Date of Patent: Feb. 23, 2021

(54) DISPLAY APPARATUS INCLUDING A MICRO LIGHT-EMITTING DIODE

(71) Applicant: SAMSUNG DISPLAY CO., LTD., Yongin-si (KR)

(72) Inventors: Jongho Hong, Yongin-si (KR); Wonsang Park, Yongin-si (KR); Wonil Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/407,006

(22) Filed: Jan. 16, 2017

(65) Prior Publication Data

US 2017/0243860 A1 Aug. 24, 2017

(30) Foreign Application Priority Data

Feb. 22, 2016 (KR) ........................ 10-2016-0020670

(51) Int. Cl.
*H01L 27/15* (2006.01)
*H01L 25/16* (2006.01)
(Continued)

(52) U.S. Cl.
CPC .......... *H01L 25/167* (2013.01); *H01L 23/481* (2013.01); *H01L 24/13* (2013.01); *H01L 24/14* (2013.01); *H01L 24/16* (2013.01); *H01L 24/17* (2013.01); *H01L 27/088* (2013.01); *H01L 24/32* (2013.01); *H01L 24/73* (2013.01); *H01L 33/62* (2013.01); *H01L 2224/0401* (2013.01); *H01L 2224/04026* (2013.01); *H01L 2224/13025* (2013.01); *H01L 2224/14181* (2013.01); *H01L 2224/1613* (2013.01); *H01L 2224/16146* (2013.01); *H01L 2224/16227* (2013.01); *H01L 2224/17181* (2013.01); *H01L 2224/32145* (2013.01); *H01L 2224/73203* (2013.01); *H01L 2224/73253* (2013.01); *H01L 2224/94* (2013.01); *H01L 2924/10253* (2013.01);
(Continued)

(58) Field of Classification Search
CPC ...................................................... H01L 27/15
See application file for complete search history.

(56) References Cited

U.S. PATENT DOCUMENTS 8,633,087 B2 1/2014 Matsubara et al.
8,791,530 B2 7/2014 Bibl et al.
(Continued)

FOREIGN PATENT DOCUMENTS

| KR | 10-2015-0045800 | 4/2015 |
| KR | 10-2015-0110910 | 10/2015 |
| WO | 2012147436 | 11/2012 |

OTHER PUBLICATIONS

Jacob Day, et al., "III-Nitride Full-Scale High-Resolution Microdisplays", Applied Physics Letters 99, 031116 (2011).

*Primary Examiner* — Jae Lee
(74) *Attorney, Agent, or Firm* — F. Chau & Associates, LLC (57) ABSTRACT

A display apparatus includes a semiconductor substrate, a transistor, and a light-emitting diode. The transistor is disposed on the semiconductor substrate and uses a portion of the semiconductor substrate as an active layer thereof. The light-emitting diode is disposed on the semiconductor substrate and is electrically connected to the transistor.

16 Claims, 10 Drawing Sheets

(51) Int. Cl.
  *H01L 23/48*   (2006.01)
  *H01L 23/00*   (2006.01)
  *H01L 27/088*  (2006.01)
  *H01L 33/62*   (2010.01)

(52) U.S. Cl.
  CPC .............. *H01L 2924/12041* (2013.01); *H01L 2924/13091* (2013.01)

(56) References Cited

U.S. PATENT DOCUMENTS

| | | | |
|---|---|---|---|
| 8,987,765 B2 | 3/2015 | Bibl et al. | |
| 2011/0057209 A1* | 3/2011 | Kim | H01L 25/167 257/88 |
| 2013/0208026 A1* | 8/2013 | Suzuki | H01L 33/36 345/690 |
| 2013/0313585 A1* | 11/2013 | Jung | H01L 33/50 257/89 |
| 2014/0159043 A1 | 6/2014 | Sakariya et al. | |
| 2015/0001685 A1* | 1/2015 | Chung | H01L 21/486 257/621 |
| 2016/0095221 A1* | 3/2016 | Ramachandran | H05K 1/115 361/783 |
| 2017/0194302 A1* | 7/2017 | Disney | H01L 33/62 |

* cited by examiner

FIG. 10

DISPLAY APPARATUS INCLUDING A MICRO LIGHT-EMITTING DIODE

CROSS-REFERENCE TO RELATED APPLICATION

This application claims priority under 35 U.S.C. § 119 to Korean Patent Application No. 10-2016-0020670, filed on Feb. 22, 2016 in the Korean Intellectual Property Office, the disclosure of which is incorporated by reference herein in its entirety.

TECHNICAL FIELD

Exemplary embodiments of the inventive concept relate to a display apparatus, and more particularly, to a display apparatus including a micro light-emitting diode.

DISCUSSION OF RELATED ART

A light-emitting diode (LED) is a device for converting an electrical signal into a form of light, such as infrared light, visible light, etc., by using a compound semiconductor. LEDs are used in, for example, household appliances, remote controllers, electronic displays, and various automation devices. From small hand-held electronic devices to large display apparatuses, the use of LEDs in a variety of devices is ever increasing.

SUMMARY

According to an exemplary embodiment of the inventive concept, a display apparatus includes a semiconductor substrate, a transistor, and a light-emitting diode. The transistor is disposed on the semiconductor substrate and uses a portion of the semiconductor substrate as an active layer thereof. The light-emitting diode is disposed on the semiconductor substrate and is electrically connected to the transistor.

The semiconductor substrate may include silicon.

The semiconductor substrate may be monocrystalline.

The light-emitting diode may be spaced apart from the transistor, and the semiconductor substrate may be disposed between the light-emitting diode and the transistor.

The light-emitting diode may be electrically connected to the transistor through a conductive via penetrating the semiconductor substrate.

The display apparatus may further include a first conductive bump disposed between the light-emitting diode and the semiconductor substrate and electrically connecting the light-emitting diode to the transistor.

The display apparatus may further include an insulating substrate disposed below the semiconductor substrate. The insulating substrate may be closer to the transistor than to the light-emitting diode.

The insulating substrate may include a flexible substrate.

The display apparatus may further include a conductive line disposed on the insulating substrate and configured to provide an electrical signal to the transistor.

The display apparatus may further include a second conductive bump disposed between the semiconductor substrate and the insulating substrate and electrically connecting the conductive line to the transistor.

A surface area of the light-emitting diode may be substantially equal to a surface area of the semiconductor substrate.

The display apparatus may further include a passivation layer surrounding a side portion of the semiconductor substrate and a side portion of the light-emitting diode. The side portion of the semiconductor substrate and the side portion of the light-emitting diode do not face each other.

According to an exemplary embodiment of the inventive concept, a display apparatus includes an insulating substrate, a first pixel disposed on the insulating substrate, and a second pixel disposed on the insulating substrate and spaced apart from the first pixel. Each of the first and second pixels includes a semiconductor substrate and a light-emitting diode.

The first pixel or the second pixel may include a transistor that uses a portion of the semiconductor substrate as an active layer thereof and is configured to drive either the light-emitting diode of the first pixel or the light-emitting diode of the second pixel.

The transistor may be spaced apart from the light-emitting diode, and the semiconductor substrate may be disposed between the transistor and the light-emitting diode.

The first pixel may emit light of a first wavelength, and the second pixel may emit light of a second wavelength different from the first wavelength.

The semiconductor substrate may be monocrystalline.

The display apparatus may further include a conductive line disposed between the insulating substrate and the semiconductor substrate and configured to provide an electrical signal to at least one of the first and second pixels.

The insulating substrate may include a flexible substrate.

According to an exemplary embodiment of the inventive concept, a display apparatus includes a light-emitting diode, an insulating substrate, and a pixel circuit. The light-emitting diode includes a first doping layer and a second doping layer. The pixel circuit is disposed between the light-emitting diode and the insulating substrate, and is electrically connected to the light-emitting diode. The first doping layer of the light-emitting diode is electrically connected to an electrode disposed on the insulating substrate via a conductive bump.

BRIEF DESCRIPTION OF THE DRAWINGS

The above and other features of the inventive concept will become apparent and more readily appreciated by describing in detail exemplary embodiments thereof with reference to the accompanying drawings.

DETAILED DESCRIPTION OF THE EMBODIMENTS

Exemplary embodiments of the inventive concept will be described more fully hereinafter with reference to the accompanying drawings. Like reference numerals may refer to like elements throughout the accompanying drawings and detailed descriptions thereof will not be repeated.

Expressions such as "at least one of," when preceding a list of elements, modify the entire list of elements and do not modify the individual elements of the list.

It will be understood that when an element or layer is referred to as being "formed on" another element or layer, it may be directly or indirectly formed on the other element or layer. For example, intervening elements or layers may be present. As used herein, the term "and/or" includes any and all combinations of one or more of the associated listed items.

Spatially relative terms, such as "above," "upper," "beneath," "below," "lower," or the like, may be used herein for ease of description to describe one element or feature's relationship to at least one other element or feature as illustrated in the figures. It will be understood that the spatially relative terms are intended to encompass different orientations of the device in use or operation, in addition to the orientation depicted in the figures.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the exemplary embodiments.

Exemplary embodiments of the inventive concept are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, the exemplary embodiments should not be construed as limited to the particular shapes of regions illustrated herein, but are to include deviations in shapes that result, for example, from manufacturing. For example, the regions illustrated in the figures are schematic in nature and their shapes might not be intended to illustrate the actual shape of a region of a device.

Exemplary embodiments of the inventive concept provide a display apparatus including a semiconductor substrate.

Exemplary embodiments of the inventive concept also provide a display apparatus having high resolution.

Exemplary embodiments of the inventive concept further provide a flexible display apparatus.

Figure 1:
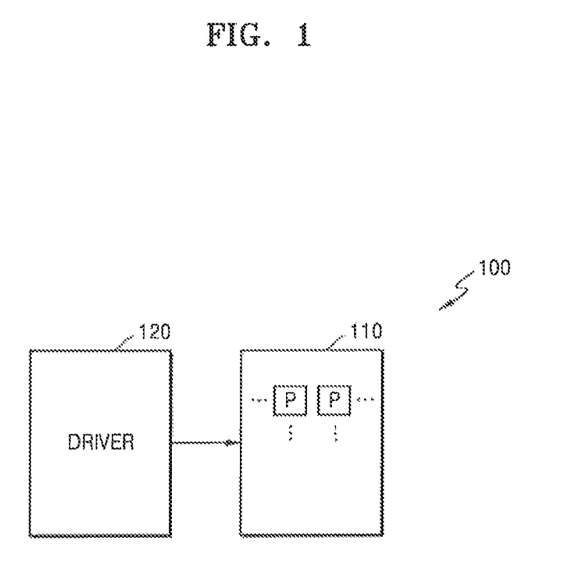
FIG. 1 is a schematic plan view of a display apparatus according to an exemplary embodiment of the inventive concept.

FIG. 1 is a schematic plan view of a display apparatus 100 according to an exemplary embodiment of the inventive concept. Referring to FIG. 1, the display apparatus 100 may include a display unit 110 and a driver 120. The display unit 110 may be arranged on a substrate and may include a plurality of pixels P. The plurality of pixels P may be arranged on the substrate in the form of a matrix. The driver 120 may include a scan driver for applying scan signals to scan lines connected to the pixels P and a data driver for applying data signals to data lines. The driver 120 may be arranged on a non-display unit of the substrate, which is disposed around the display unit 110 on which the plurality of pixels P is arranged. The driver 120 may be an integrated circuit chip directly mounted on the substrate on which the display unit 110 is formed, may be mounted on a flexible printed circuit film, may be coupled to the substrate in the form of a tape carrier package (TCP), or may be directly formed on the substrate.

Figure 2:
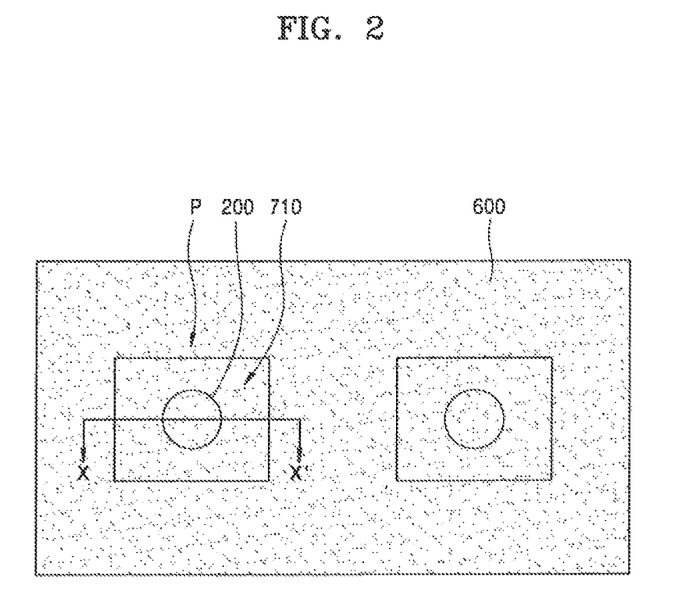
FIG. 2 is a schematic plan view of a pixel of the display apparatus illustrated in FIG. 1 according to an exemplary embodiment of the inventive concept.
Figure 3:
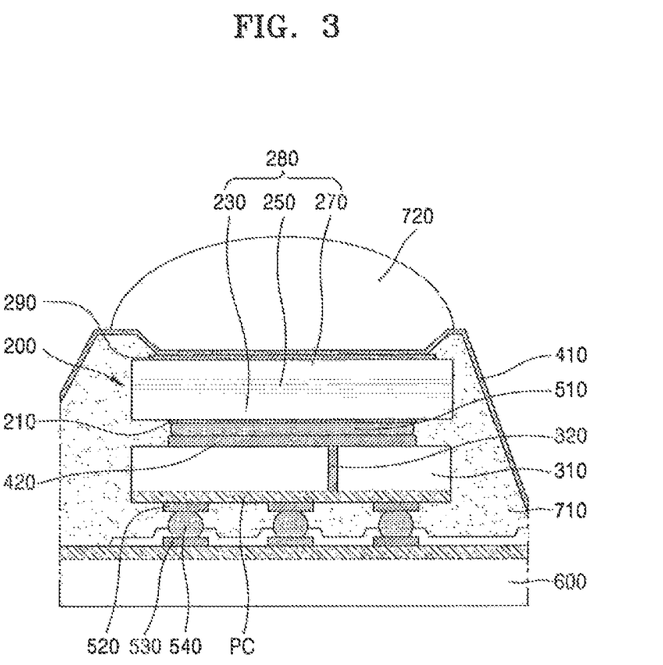
FIG. 3 is a cross-sectional view taken along a line X-X' of FIG. 2 according to an exemplary embodiment of the inventive concept.

FIG. 2 is a schematic plan view of the pixel P of the display apparatus 100 illustrated in FIG. 1 according to an exemplary embodiment of the inventive concept. FIG. 3 is a cross-sectional view taken along a line X-X' of FIG. 2, and FIG. 4 is a cross-sectional view of a semiconductor substrate and a transistor of the pixel of FIG. 2.

Figure 4:
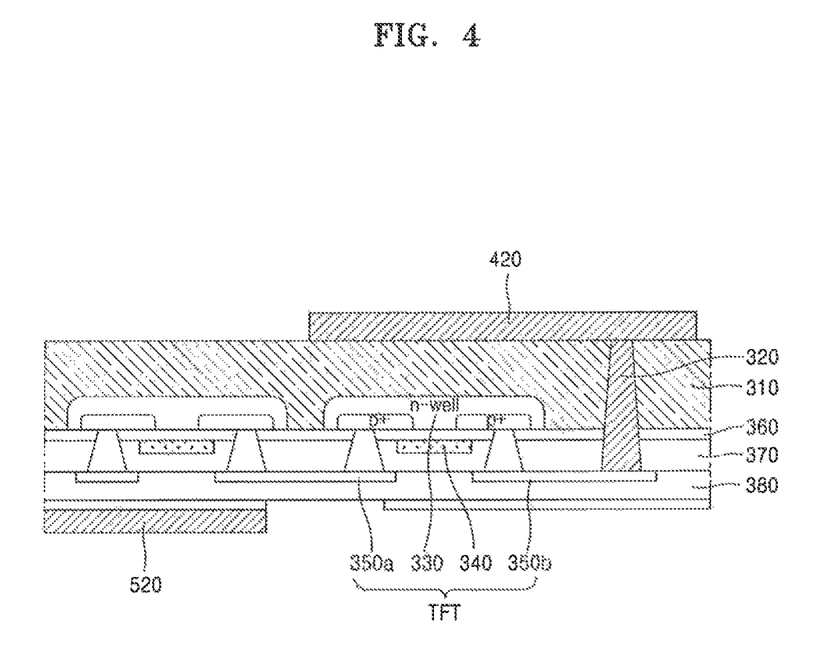
FIG. 4 is a cross-sectional view of a semiconductor substrate and a transistor of the pixel of FIG. 2 according to an exemplary embodiment of the inventive concept.

Referring to FIGS. 2 through 4, each pixel P may include a light-emitting diode (LED) 200 and a pixel circuit PC connected to the LED 200. The pixel circuit PC may include at least one transistor TFT and at least one capacitor. The pixel circuit PC is connected to one of the scan lines and one of the data lines, which cross each other. FIG. 4 illustrates two transistors TFT where one of the two transistors TFT is connected to the LED 200.

The LED 200 may be a micro LED. Here, the term "micro" may refer to a size of 1 through 100 μm. However, the inventive concept is not limited thereto, and the LED 200 may be larger than 100 μm or smaller than 1 μm. The LED 200 may emit light of one or more wavelengths within the wavelength spectrum of ultraviolet (UV) light to visible light. For example, the LED 200 may be a red, green, blue, or white LED, or a UV LED. According to an exemplary embodiment of the inventive concept, the LED 200 of at least two of the pixels P may emit light of different wavelengths.

The LED 200 may include a p-n diode 280, a first contact electrode 210, and a second contact electrode 290. The first contact electrode 210 and/or the second contact electrode 290 may include at least one layer, and may include various conductive materials such as a metal, a conductive oxide, or a conductive polymer. The first contact electrode 210 or the second contact electrode 290 may optionally include a reflective layer, for example, a silver layer.

The p-n diode 280 may include a p-doping layer 230 at a lower portion thereof, at least one quantum well layer 250, and an n-doping layer 270 at an upper portion thereof. According to an exemplary embodiment of the inventive concept, the upper doping layer of the p-n diode 280 may instead be a p-doping layer, and the lower doping layer may be an n-doping layer. The p-n diode 280 may have a straight-type side wall, or a side wall that is tapered in an up to down or down to up direction.

A semiconductor substrate 310 may be arranged below the LED 200. The semiconductor substrate 310 may include silicon, germanium, silicon-germanium, a group III-V semiconductor, a group II-VI semiconductor, a semiconducting carbon nanotube (CNT), molybdenum disulfide ($MoS_2$), indium-zinc oxide (IZO), gallium-indium-zinc oxide (GIZO), etc. Any one of an n-type impurity and a p-type impurity may be injected into the semiconductor substrate 310. In the present exemplary embodiment illustrated in FIG. 4, the p-type impurity is injected into the semiconductor substrate 310. Additionally, the semiconductor substrate 310 may be a monocrystalline substrate. For example, the semiconductor substrate 310 may be a monocrystalline silicon substrate.

The pixel circuit PC may be arranged at a rear surface of the semiconductor substrate 310. For example, the pixel circuit PC may be arranged below the semiconductor substrate 310. The pixel circuit PC may be electrically connected to the LED 200 through a conductive via 320 penetrating the semiconductor substrate 310. As described above, the pixel circuit PC may include at least one transistor TFT and at least one capacitor. FIG. 4 illustrates two transistors TFT. One of the two transistors TFT may be connected to the LED 200 through the conductive via 320.

As illustrated in FIG. 4, the transistor TFT includes an active layer 330, a gate electrode 340, a source electrode 350a, and a drain electrode 350b. The active layer 330 may be an area or portion of the semiconductor substrate 310, and may have a source area, a drain area, and a channel area between the source area and the drain area.

For example, the active layer 330 may be a quantum well layer formed in an area of the semiconductor substrate 310. The quantum well layer may be an N-type well. The drain area and the source area may be formed by doping a dopant, which is a charge carrier, with a high concentration. The drain area and the source area may be p-type areas. Thus, the transistor TFT may be a p-channel transistor having a p-type dopant as a carrier. Alternatively, the drain area and the source area may be formed in another area of the semiconductor substrate 310 by doping an n-type dopant, which is a carrier, with a high concentration. In other words, the transistor TFT may be an n-channel transistor having the n-type dopant as a carrier. FIG. 4 illustrates the two transistors TFT as a p-channel transistor and an n-channel transistor.

The gate electrode 340 is formed on the active layer 330 to correspond to the channel area. The source electrode 350a and the drain electrode 350b are electrically connected to the source area and the drain area of the active layer 330, respectively.

A first insulating layer 360 including an inorganic insulating material is arranged between the active layer 330 and the gate electrode 340, as a gate insulating layer. A second insulating layer 370 is arranged between the gate electrode 340 and the source electrode 350a/drain electrode 350b, as an interlayer insulating layer. A third insulting layer 380 is arranged over the source electrode 350a/drain electrode 350b as a planarization layer. The second insulating layer 370 and the third insulating layer 380 may include an organic insulating material or an inorganic insulating material, or may alternately include an organic insulating material and an inorganic insulating material.

A first electrode 410 contacting the second contact electrode 290 may further be arranged. The first electrode 410 may include a transparent or semi-transparent electrode. For example, the first electrode 410 may include a conductive material, such as a transparent conductive oxide (TCO) (e.g., indium tin oxide (ITO), IZO, zinc oxide (ZnO), or indium (III) oxide ($In_2O_3$)), a CNT film, or a transparent conductive polymer. The first electrode 410 may be an electrode common to the pixels P.

A second electrode 420 may be arranged on an upper surface of the semiconductor substrate 310. The second electrode 420 is electrically connected to the source electrode 350a or the drain electrode 350b of the transistor TFT via the conductive via 320 penetrating the semiconductor substrate 310, the first insulating layer 360, and the second insulating layer 370. FIG. 4 illustrates that the second electrode 420 is electrically connected to the drain electrode 350b via the conductive via 320.

The second electrode 420 may include one or more layers. For example, the second electrode 420 may include a metal material, such as aluminum, molybdenum, titanium, tungsten, silver, a metal, or an alloy thereof. The second electrode 420 may include a reflective layer, and may also include a transparent conductive layer including a conductive material such as TCO (e.g., ITO, IZO, ZnO, or $In_2O_3$), a CNT film, or a transparent conductive polymer. According to an exemplary embodiment of the inventive concept, the second electrode 420 may be a triple layer including upper and lower transparent conductive layers and a reflective layer situated therebetween.

The second electrode 420 may be connected to the first contact electrode 210 via a first conductive bump 510. Thus, the second electrode 420 may be electrically connected to the LED 200.

Additionally, a first conductive pad 520 may be disposed under the semiconductor substrate 310. The first conductive pad 520 may be electrically connected to the pixel circuit PC, and the pixel circuit PC may be electrically connected to a conductive line arranged on an insulating substrate 600, through the first conductive pad 520, a second conductive pad 530, and a second conductive bump 540.

The insulating substrate 600 may be disposed below the semiconductor substrate 310. The insulating substrate 600 may include glass, plastic, or the like. A buffer layer may be disposed on the insulating substrate 600. The buffer layer may prevent penetration of impurities into the insulating substrate 600, may planarize a surface, and may be formed as a single layer or multiple layers including an inorganic material, such as silicon nitride (SiNx) and/or silicon oxide (SiOx).

The conductive line, which may be, for example, a scan line, a data line, or a power line, may be arranged on the buffer layer. For example, the scan line extending in a first direction and the data line extending in a second direction crossing the first direction may be arranged on the buffer layer. The data line may apply a data signal provided by a driver (e.g., the driver 120 of FIG. 1) to each pixel P, and the scan line may apply a scan signal provided by the driver to each pixel P. A portion of the conductive line may contact the second conductive pad 530, and a remaining portion of the conductive line may be covered by an insulating material. Additionally, the first conductive pad 520 and the second conductive pad 530 may contact the second conductive bump 540. Thus, as described above, the conductive line may be electrically connected to the pixel circuit PC arranged on the semiconductor substrate 310, via the first conductive pad 520, the second conductive pad 530, and the second conductive bump 540.

As described above, the insulating substrate 600, on which the conductive line providing the scan signal and the data signal is arranged, and the semiconductor substrate 310, on which the transistor TFT is arranged, are disposed apart from each other, which may increase usability of the display apparatus. For example, a flexible display apparatus may be realized by forming the insulating substrate 600 using a flexible material. Moreover, since the pixel circuit PC including the transistor TFT is arranged on the semiconductor substrate 310, the size of the pixel circuit PC may be reduced and the pixel P may be miniaturized. Thus, a display apparatus having high resolution may be realized.

Furthermore, a passivation layer 710 surrounds a side portion of the semiconductor substrate 310 and a side portion of the LED 200. The passivation layer 710 is formed so as not to cover an upper portion of the LED 200, for example, the passivation layer 710 is formed so that the second contact electrode 290 is exposed. The passivation layer 710 may include an organic insulating material. For example, the passivation layer 710 may include acryl, polymethyl methacrylate (PMMA), benzocyclobutene (BCB), polyimide, acrylate, epoxy, polyester, etc. However, materials included in the passivation layer 710 are not limited thereto. Additionally, the first electrode 410 electrically connected to the exposed second contact electrode 290 of the LED 200 is formed on the passivation layer 710.

The display apparatus 100 according to an exemplary embodiment of the inventive concept may further include a capping layer 720 covering the LED 200. The capping layer 720 may include a transparent polymer, such as epoxy, silicon, urethane, etc. According to an exemplary embodiment of the inventive concept, the capping layer 720 may include a thermoplastic resin or a thermosetting resin, such as an acrylic resin (e.g., PMMA, polyhydroxy ethylmethacrylate, and polycyclohexyl methacrylate) an allylic resin (e.g., polydiethyleneglycol bisallylcarbonate and polycarbonate), a methacryl resin, a polyurethane-based resin, a polyester-based resin, a polyfluorinevinyl-based resin, a poly acetate vinyl-based resin, a cellulose-based resin, a polyamide-based resin, a fluorine-based resin, a polypropylene-based resin, a polystyrene-based resin, or a combination thereof.

The capping layer 720 may include a material having a refractive index n_lens which is greater than 1. The material included in the capping layer 720 may be selected such that the refractive index n_lens of the capping layer 720, a refractive index n_LED of the LED 200, and a refractive index n_air of air have a relationship of n_air<n_lens<n_LED. Since the capping layer 720 may reduce the difference in refractive indices on an interfacial surface (e.g., between the LED 200 and outside air), light lost from the LED 200 into air may be reduced.

FIGS. 5 through 9 are reference views for describing a method of manufacturing a display apparatus, according to an exemplary embodiment of the inventive concept.

Figure 5:
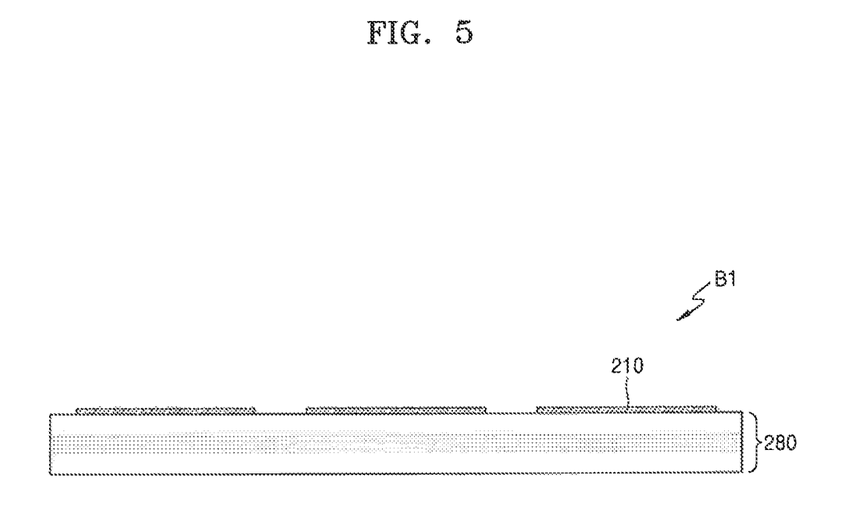
FIGS. 5 through 9 are reference views for describing a method of manufacturing a display apparatus, according to an exemplary embodiment of the inventive concept.

First, a first block B1 including the LED 200 may be formed as illustrated in FIG. 5. A plurality of p-n diodes 280 may be formed on a base substrate. The base substrate may include a conductive substrate or an insulating substrate. For example, the base substrate may include at least one of sapphire (Al$_2$O$_3$), SiC, Si, GaAs, GaN, ZnO, Si, GaP, InP, Ge, or Ga2O3.

Each of the plurality of p-n diodes 280 may include a first semiconductor layer (e.g., the p-doping layer 230 of FIG. 3), a second semiconductor layer (e.g., the n-doping layer 270 of FIG. 3), and an intermediate layer (e.g., the quantum well layer 250 of FIG. 3) between the first semiconductor layer and the second semiconductor layer. The first semiconductor layer, the intermediate layer, and the second semiconductor layer may be formed by using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), etc.

The first contact electrode 210 may be formed on a side of each of the plurality of p-n diodes 280. The first contact electrode 210 may include at least one layer, and may include various conductive materials, such as a metal, a conductive oxide, or a conductive polymer. It is illustrated in FIG. 5 that the first contact electrode 210 is formed on the p-n diode 280 to form the LED 200. However, the inventive concept is not limited thereto. The second contact electrode 290, the p-n diode 280, and the first contact electrode 210 may be sequentially formed on the base substrate in this order.

Figure 6:
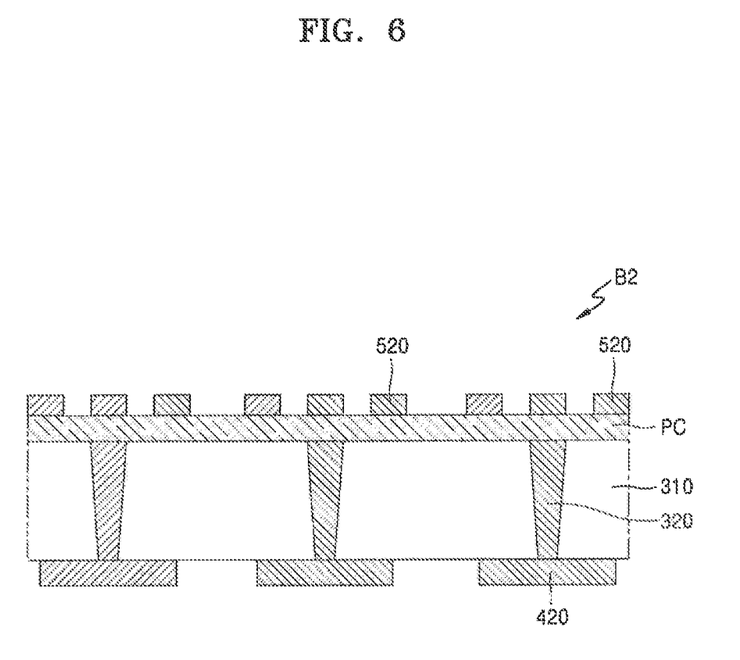

Additionally, a second block B2, including the pixel circuit PC and the semiconductor substrate 310, may be prepared as illustrated in FIG. 6. The semiconductor substrate 310 may include silicon, germanium, silicon-germanium, a group III-V semiconductor, a group II-VI semiconductor, a semiconducting CNT, MoS2, IZO, GIZO, etc. The semiconductor substrate 310 may be doped with either an n-type impurity or a p-type impurity. For example, the p-type impurity may be injected into the semiconductor substrate 310.

Furthermore, the pixel circuit PC may be formed on a surface of the semiconductor substrate 310. For example, a quantum well layer may be formed in an area of the semiconductor substrate 310. The quantum well layer may be an N-type well. A drain area and a source area may be formed by doping a dopant, which is a charge carrier, with a high concentration, so that this area of the semiconductor substrate 310 may be the active layer 330 of the transistor TFT. Moreover, the first insulating layer 360, the gate electrode 340, the second insulating layer 370, the source electrode 350a, the drain electrode 350b, and the third insulating layer 380 may be sequentially formed in this stated order on a first surface of the semiconductor substrate 310 to form the transistor TFT on the semiconductor substrate 310.

In addition to the transistor, other elements of the pixel circuit PC may also be formed on the first surface of the semiconductor substrate 310. Furthermore, as previously described, the third insulating layer covering the transistor may be formed on the first surface of the semiconductor substrate 310, and the first conductive pad 520 electrically connected to the pixel circuit PC may be formed on the third insulating layer.

In addition, the conductive via 320, connected to the source electrode 350a or the drain electrode 350b of the transistor TFT and penetrating the second insulating layer 370, the first insulating layer 360, and the semiconductor substrate 340, may be formed, and the second electrode 420 connected to the conductive via 320 may be formed on a second surface of the semiconductor substrate 310. The second surface may be a surface opposite the first surface of the semiconductor substrate 310.

Figure 7:
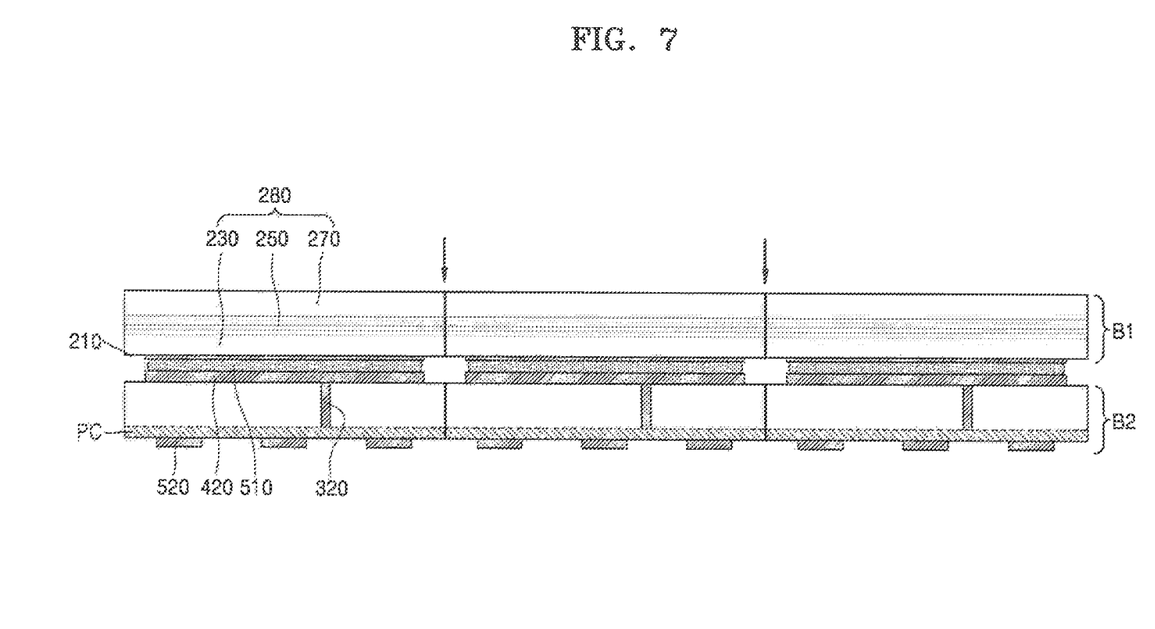

Additionally, as illustrated in FIG. 7, the first block B1 and the second block B2 may be coupled to each other. The first block B1 and the second block B2 may be coupled to each other by the first conductive bump 510. After the first block B1 and the second block B2 are coupled to each other, the first block B1 and the second block B2 may be cut to form a pixel unit. For example, the first block B1 and the second block B2 may be cut into units, each corresponding to one of the pixels P, but the inventive concept is not limited thereto. For example, the first block B1 and the second block B2 may be cut into units corresponding to groups of pixels P. FIG. 7 illustrates that the first block B1 and the second block B2 are cut into units of one pixel each to form the pixels P. Since the pixel P is formed by cutting the first block B1 and the second block B2, the surface area of the LED 200 may be substantially the same as the surface area of the semiconductor substrate 310.

Figure 8:
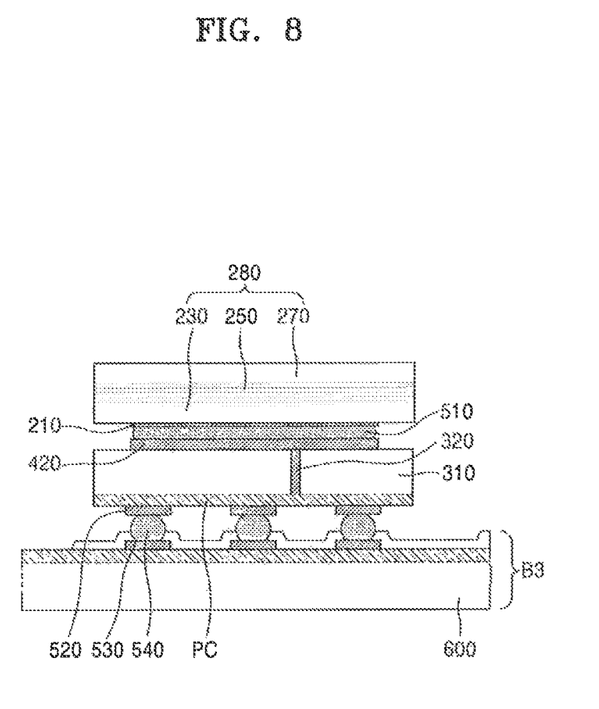

After cutting, the pixel P may be coupled to a third block B3 illustrated in FIG. 8 by the second conductive bump 540. The third block B3 may be formed by forming, on the insulating substrate 600, a conductive line (e.g., a data line, a scan line, and/or a power line), an insulating material covering the conductive line, and the second conductive pad 530 arranged on the insulating material and connected to the conductive line. The third block B3 may be a substrate of the display apparatus.

Figure 9:
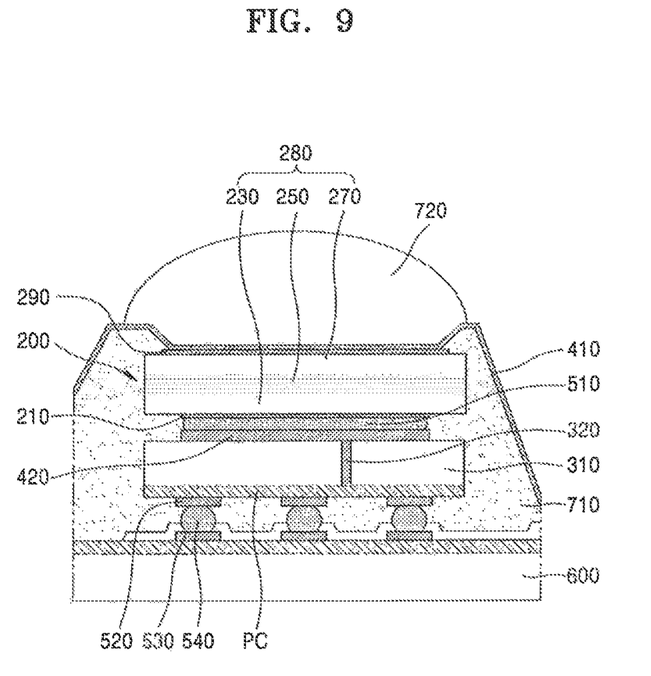

Finally, as illustrated in FIG. 9, to manufacture the display apparatus, the passivation layer 710 may be formed to surround a side portion of the semiconductor substrate 310 and a side portion of the LED 200, the second electrode 420 may be formed on the LED 200, and the capping layer 720 may be formed on the LED 200.

Figure 10:
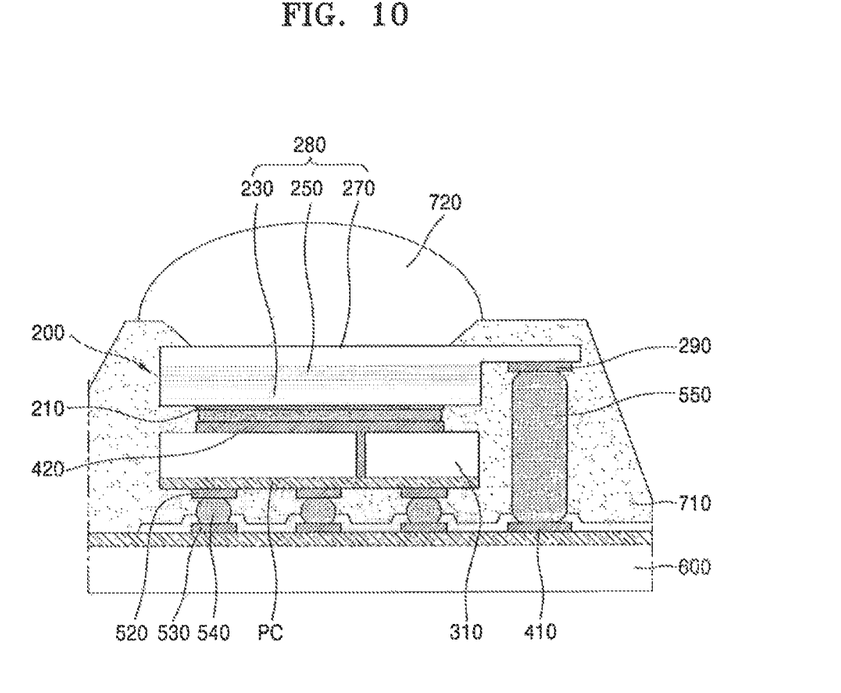
FIG. 10 is a cross-sectional view showing a pixel included in a display apparatus according to an exemplary embodiment of the inventive concept.

FIG. 10 is a cross-sectional view of the pixel P included in a display apparatus according to an exemplary embodiment of the inventive concept. In contrast to the arrangement illustrated in FIG. 3, the second contact electrode 290 may be arranged on a lower surface of the upper doping layer of the p-n diode 280 (e.g., the n-doping layer 270), as illustrated in FIG. 10. Additionally, the second contact electrode 290 may be electrically connected via a third conductive bump 550 to the first electrode 410 arranged on the insulating substrate 600.

As described above, since the pixel circuit PC, including a transistor (e.g., the transistor TFT), is formed on the semiconductor substrate 310, the size of the pixel circuit PC may be reduced. Thus, the display apparatus having a high resolution may be realized. In addition, a flexible display apparatus may be realized by using a flexible substrate.

Furthermore, as described above, according to exemplary embodiments of the inventive concept, since the pixel circuit PC is arranged on the semiconductor substrate 310, the size of the pixel P may be reduced.

While the inventive concept has been shown and described with reference to the exemplary embodiments thereof, it will be understood by those of ordinary skill in the art that various changes in form and details may be made thereto without departing from the spirit and scope of the present inventive concept.

What is claimed is:

1. A display apparatus comprising:
a semiconductor substrate;
a transistor disposed on the semiconductor substrate and using a portion of the semiconductor substrate as an active layer thereof, wherein the active layer of the semiconductor substrate includes a source region, a drain region, and a channel region disposed between the source region and the drain region;
a light-emitting diode disposed on the semiconductor substrate and electrically connected to the transistor, the light-emitting diode including a p-n diode;
an insulating substrate disposed below the semiconductor substrate, wherein the insulating substrate is closer to the transistor than to the light-emitting diode, and is disposed apart from the semiconductor substrate;
a conductive line disposed on the insulating substrate and configured to provide an electrical signal to the transistor;
a first conductive bump disposed between the semiconductor substrate and the conductive line and electrically connecting the conductive line to the transistor, wherein the first conductive bump separates the insulating substrate from the semiconductor substrate; and
a passivation layer surrounding a side portion of the semiconductor substrate and a side portion of the light-emitting diode, and contacting the first conductive bump,
wherein the side portion of the semiconductor substrate and the side portion of the light-emitting diode do not face each other, and
wherein the p-n diode and the semiconductor substrate are equal in width and are aligned in a cross-sectional view.

2. The display apparatus of claim 1, wherein the semiconductor substrate comprises silicon.

3. The display apparatus of claim 2, wherein the semiconductor substrate is monocrystalline.

4. The display apparatus of claim 1, wherein the light-emitting diode is spaced apart from the transistor, and the semiconductor substrate is disposed between the light-emitting diode and the transistor.

5. The display apparatus of claim 1, wherein the light-emitting diode is electrically connected to the transistor through a conductive via penetrating the semiconductor substrate.

6. The display apparatus of claim 5, further comprising a second conductive bump disposed between the light-emitting diode and the semiconductor substrate and electrically connecting the light-emitting diode to the transistor.

7. The display apparatus of claim 1, wherein the insulating substrate comprises a flexible substrate.

8. The display apparatus of claim 1, wherein a surface area of the light-emitting diode is substantially equal to a surface area of the semiconductor substrate.

9. A display apparatus comprising:
an insulating substrate;
a first pixel disposed on the insulating substrate; and
a second pixel disposed on the insulating substrate and spaced apart from the first pixel,
wherein each of the first and second pixels comprises a semiconductor substrate, a light-emitting diode including a first electrode and a second electrode, a passivation layer on the light-emitting diode, and a transistor electrically connected to the first electrode,
the passivation layer of the first pixel has an opening which overlaps the light-emitting diode of the first pixel,
the passivation layer of the second pixel has an opening which overlaps the light-emitting diode of the second pixel,
the second electrode of the light-emitting diode of the first pixel and the second electrode of the light-emitting diode of the second pixel are electrically connected via an electrode common to the first and second pixels,
the electrode common to the first and second pixels is disposed over the opening of the passivation layer of the first pixel and the opening of the passivation layer of the second pixel, and
the electrode common to the first and second pixels includes a transparent or semi-transparent electrode.

10. The display apparatus of claim 9, wherein the first pixel or the second pixel comprises a transistor that uses a portion of the semiconductor substrate as an active layer thereof and is configured to drive either the light-emitting diode of the first pixel or the light-emitting diode of the second pixel.

11. The display apparatus of claim 10, wherein the transistor is spaced apart from the light-emitting diode, and the semiconductor substrate is disposed between the transistor and the light-emitting diode.

12. The display apparatus of claim 9, wherein the first pixel emits light of a first wavelength, and the second pixel emits light of a second wavelength different from the first wavelength.

13. The display apparatus of claim 9, wherein the semiconductor substrate is monocrystalline.

14. The display apparatus of claim 9, further comprising a conductive line disposed between the insulating substrate and the semiconductor substrate and configured to provide an electrical signal to at least one of the first and second pixels.

15. The display apparatus of claim 9, wherein the insulating substrate comprises a flexible substrate.

16. A display apparatus comprising:
a semiconductor substrate;
a transistor disposed on the semiconductor substrate and using a portion of the semiconductor substrate as an active layer thereof, wherein the active layer of the semiconductor substrate includes a source region, a drain region, and a channel region disposed between the source region and the drain region;

a light-emitting diode disposed on the semiconductor substrate and electrically connected to the transistor, the light-emitting diode including a p-n diode;

an insulating substrate disposed below the semiconductor substrate, wherein the insulating substrate is closer to the transistor than to the light-emitting diode, and is disposed apart from the semiconductor substrate;

a conductive line disposed on the insulating substrate and configured to provide an electrical signal to the transistor;

a plurality of first conductive bumps disposed between the semiconductor substrate and the conductive line and electrically connecting the conductive line to the transistor, wherein the first conductive bumps separate the insulating substrate from the semiconductor substrate; and a passivation layer surrounding a side portion of the semiconductor substrate and a side portion of the light-emitting diode, and contacting the first conductive bump, wherein the side portion of the semiconductor substrate and the side portion of the light-emitting diode do not face each other, and wherein the p-n diode and the semiconductor substrate are equal in width and are alined in a cross-sectional view.

* * * * *